(12) United States Patent
Talieh

(10) Patent No.: US 6,902,659 B2
(45) Date of Patent: Jun. 7, 2005

(54) METHOD AND APPARATUS FOR ELECTRO-CHEMICAL MECHANICAL DEPOSITION

(75) Inventor: Homayoun Talieh, San Jose, CA (US)

(73) Assignee: ASM Nutool, Inc., Fremont, CA (US)

( * ) Notice: Subject to any disclaimer, the term of this patent is extended or adjusted under 35 U.S.C. 154(b) by 26 days.

(21) Appl. No.: 10/238,665

(22) Filed: Sep. 9, 2002

(65) Prior Publication Data

US 2003/0006147 A1 Jan. 9, 2003

Related U.S. Application Data

(60) Continuation of application No. 09/607,567, filed on Jun. 29, 2000, now Pat. No. 6,676,822, which is a division of application No. 09/201,929, filed on Dec. 1, 1998, now Pat. No. 6,176,992.

(51) Int. Cl.[7] .................................................. C25F 3/16
(52) U.S. Cl. ....................... 205/117; 205/659; 205/125; 205/662
(58) Field of Search ................................. 205/662, 663, 205/117–118, 122, 125, 659; 204/271, 224 M

(56) References Cited

U.S. PATENT DOCUMENTS

| | | | | |
|---|---|---|---|---|
| 3,779,887 A | * | 12/1973 | Gildone | .................. 204/224 R |
| 3,595,089 A | | 5/1976 | Watts | |
| 3,959,089 A | | 5/1976 | Watts | |
| 4,431,501 A | * | 2/1984 | Leppanen | ................ 204/224 R |
| 4,609,450 A | * | 9/1986 | Seimiya et al. | ............. 204/217 |
| 4,610,772 A | | 9/1986 | Palnik | |
| 5,024,735 A | | 6/1991 | Kadija | |
| 5,171,412 A | | 12/1992 | Talieh et al. | |
| 5,429,733 A | | 7/1995 | Ishida | |
| 5,558,568 A | | 9/1996 | Talieh et al. | |
| 5,692,947 A | | 12/1997 | Talieh et al. | |
| 5,700,366 A | | 12/1997 | Steblianko et al. | |
| 5,755,859 A | | 5/1998 | Brusic et al. | |
| 5,807,165 A | | 9/1998 | Uzoh et al. | |
| 5,833,820 A | | 11/1998 | Dubin | |
| 5,863,412 A | | 1/1999 | Ichinose et al. | |
| 5,930,669 A | | 7/1999 | Uzoh | |
| 5,933,753 A | | 8/1999 | Simon et al. | |
| 6,004,880 A | | 12/1999 | Liu et al. | |
| 6,143,155 A | | 11/2000 | Adams et al. | |
| 6,210,554 B1 | | 4/2001 | Kosaki et al. | |

OTHER PUBLICATIONS

Contolini, R.C., et al., "Electrochemical Planarization for Multilevel Metallization", Sep. 1994, pp. 2503–2510.
Madore, C., et al., "Blocking Inhibitors in Catholic Leveling," *Theoretical Analysis*, Dec. 1996, pp. 3927–3942.
Steigerwald, J.M., et al., "Pattern Geometry Effects in the Chemical–Mechanical Polishing of Inlaid Copper Structures", Oct. 1994, pp. 2842–2848.
West, A.C., et al., "Pulse Reverse Copper Electrodeposition in High Aspect Ratio Trenches and Vias", Sep. 1998, pp. 3070–3073.

* cited by examiner

*Primary Examiner*—Donald R. Valentine
(74) *Attorney, Agent, or Firm*—Knobbe, Martens, Olson & Bear LLP.

(57) ABSTRACT

The present invention deposits a conductive material from an electrolyte solution to a predetermined area of a wafer. The steps that are used when making this application include applying the conductive material to the predetermined area of the wafer using an electrolyte solution disposed on a surface of the wafer, when the wafer is disposed between a cathode and an anode, and preventing accumulation of the conductive material to areas other than the predetermine area by mechanically polishing the other areas while the conductive material is being applied.

37 Claims, 5 Drawing Sheets

METHOD AND APPARATUS FOR ELECTRO-CHEMICAL MECHANICAL DEPOSITION

RELATED APPLICATIONS

This is a continuation of U.S. Ser. No. 09/607,567 filed Jun. 29, 2000, now U.S. Pat. No. 6,676,822, which is a divisional of U.S. Ser. No. 09/201,929 filed Dec. 1, 1998, now U.S. Pat. No. 6,176,992, incorporated herein by reference.

BACKGROUND OF THE INVENTION

1. Field of the Invention

The present invention relates to a Method and Apparatus for Electro Chemical Mechanical Deposition, and more particularly, to a method and apparatus that provides for both the deposition and polishing of a conductive material on a semiconductor wafer.

2. Background of the Invention

Metallization of semiconductor wafers, i.e. deposition of a layer of metal on the face of wafers over a barrier/seed layer of metal has important and broad application in the semiconductor industry. Conventionally, aluminum and other metals are deposited as one of many metal layers that make up a semiconductor chip. More recently, there is great interest in the deposition of copper for interconnects on semiconductor chips, since, as compared to aluminum, copper reduces electrical resistance and allows semiconductor chips using copper to run faster with less heat generation, resulting in a significant gain in chip capacity and efficiency.

Conformal thin film deposition of copper into deep submicron via holes and trenches is becoming more difficult in ULSI chip processing, especially when the feature sizes are decreasing below the 0.25 $\mu$m with aspect rations of greater that 5 to 1. Common chemical vapor deposition and electroplating techniques have been used to fill these deep cavities etched into silicon substrates. These processes so far have yielded a very high cost and defect density for developing and integrating local interconnects for ULSI technology.

One of the factors that contributes to the high cost is the manner in which the conductive material, and particularly copper, is applied, Specifically, it is well known to apply certain contaminants, known as leveling agents, in the electrolyte solution that prevent or slow down the rate of deposition of the metal to the surface of the wafer substrate. Since these contaminants have a large size in comparison to the size of the typical vie that needs to be filled, deposition of the metal on the surface of the wafer is, in part, prevented. This prevention, however, is achieved at the expense of adding contaminants to the electrolytic solution, which results, in part, in vias that do not have the desired conductive characteristics. In particular, the grain size of the deposited conductor, due to the use of such contaminants, is not as large as desired, which thereby results in quality problems for the resulting device, as well as increased expense due to significant annealing times that are subsequently required.

Further, the cost of achieving the desired structure, in which the conductive material exists in the via, but not on the substrate surface, still required separate deposition and polishing steps. After the conventional deposition of the metal using an anode, a cathode and electrolytic solution containing metal as is known, there is then required a polishing step, which polishing step is, for high performance devices at the present time, typically a chemical-mechanical polishing step. While chemical mechanical polishing achieves the desired result, it achieves it at considerable expense, and requires a great degree of precision in applying a slurry in order to achieve the desired high degree of polish on the conductive surface.

Accordingly, a less expensive and more accurate manner of applying a conductor to a semiconductor wafer is needed

SUMMARY OF THE INVENTION

It is an object of the present invention to provide a method and apparatus that both deposits and polishes a conductive material on a semiconductor wafer.

It is an object of the present invention to provide a method and apparatus that simultaneously deposits and polishes a conductive material on a semiconductor wafer.

It is an object of the present invention to provide a method and apparatus that simultaneously deposits a conductive material in deep cavities of a semiconductor wafer and polishes/starves electrolytic solution from the top surface area of the semiconductor wafer.

It is a further object of the present invention to provide a method and apparatus that recirculates the electrolytic solution used in depositing the conductive material on the semiconductor wafer.

These and other object of the present invention are obtained by depositing a conductive material form an electrolyte solution to a predetermined area of a wafer. The steps that are used when making this application include applying the conductive material to the predetermined area of the wafer using an electrolyte solution disposed on a surface of the wafer when the wafer is disposed in proximity to an anode, and preventing accumulation of the conductive material to areas other than the predetermined area by mechanically polishing, protecting, or reducing form electrolyte contact to the other areas while the conductive material is being deposited.

An apparatus that performs this method includes an anode capable of receiving a first potential upon application of power, A cathode or the wafer is spaced from the anode and is capable of receiving a second potential opposite the first potential upon application of power. A pad or a multiple number of pads is/are disposed between the anode and the cathode, the pad being movable with respect to a surface of the wafer and inhibiting or reducing application of the conductive material to certain other areas when power is being supplied to the anode and the cathode. Further, a fluid chamber allows an electrolyte solution to be disposed on the surface of the wafer or the pad and the conductive material to be formed on desired areas of the wafer upon application of power.

BRIEF DESCRIPTION OF THE DRAWINGS

These and other objects and advantages of the present invention will become apparent and more readily appreciated from the following detailed description of the presently preferred exemplary embodiment of the invention taken in conjunction with the accompanying drawings, of which.

DETAILED DESCRIPTION OF THE PREFERRED EMBODIMENTS

The preferred embodiments of the present invention will now be described. As noted above, conventional processing uses different equipment, at different times, in order to obtain conductive material within vias or at other desired locations on the surface of a semiconductor wafer that contains many different semiconductor chips, but not have the conductive material disposed at undesired locations. Accordingly, the equipment cost needed to manufacture a high quality semiconductor integrated circuit device can be exorbitant.

The present invention contemplates different embodiments which allow for the same device, termed a "electro chemical mechanical deposition apparatus", to be used to both deposit a conductive material as well as then polish or reduce the rate of deposition of that conductive material. The "electro chemical mechanical deposition apparatus" can also be used to simultaneously deposit and/or polish the conductive material. While the present invention can be used with any conductive material or any workpiece suitable for plating it is especially suited for use with copper as the conductor, and for use in the fabrication of ULSI integrated circuits having submicron features with large aspect ratios. In the various embodiments, the present invention uses conventional components, arranged in a unique manner, in order to achieve the functionalities described herein.

Figure 3:
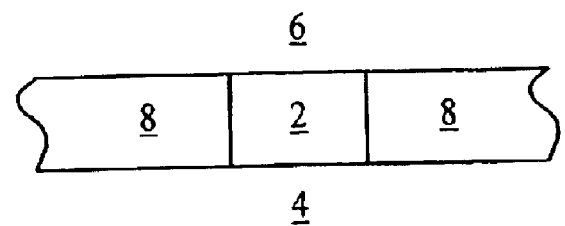
FIG. 3 illustrates a representative via to be filled with a conductor according to the present invention.

FIG. 3 is first referred to in order to illustrate a portion of an integrated circuit chip that includes an area in which a via is to be formed, The via, as known in the semiconductor arts, being a conductive material that electrically connects different circuit layers together. AS shown in FIG. 3, a via contains a conductor 2 that can connect a lower level conductive area 4 with an upper level conductive area 6, with insulative material 8 disposed there around. Of course, it is understood that the present invention can operate upon any metal layer of a multi-layer integrated circuit chip.

Figure 1A:
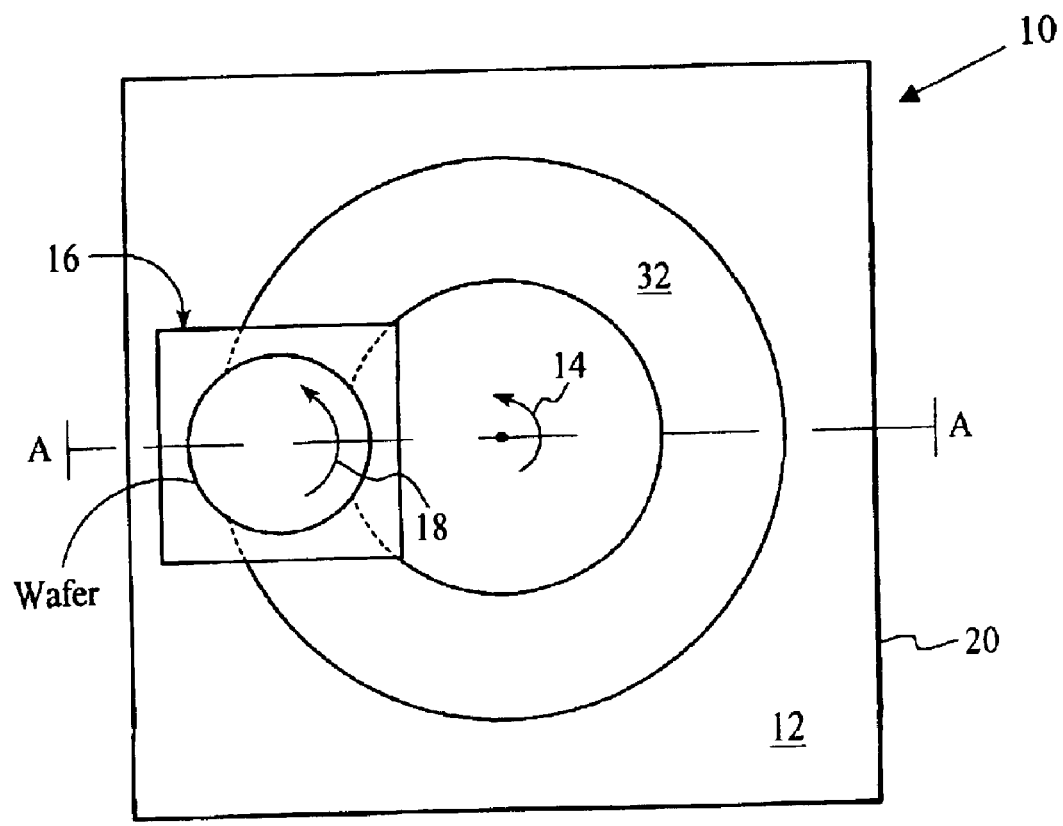
FIGS. 1A and 1B illustrate a first embodiment of the present invention.
Figure 1B:
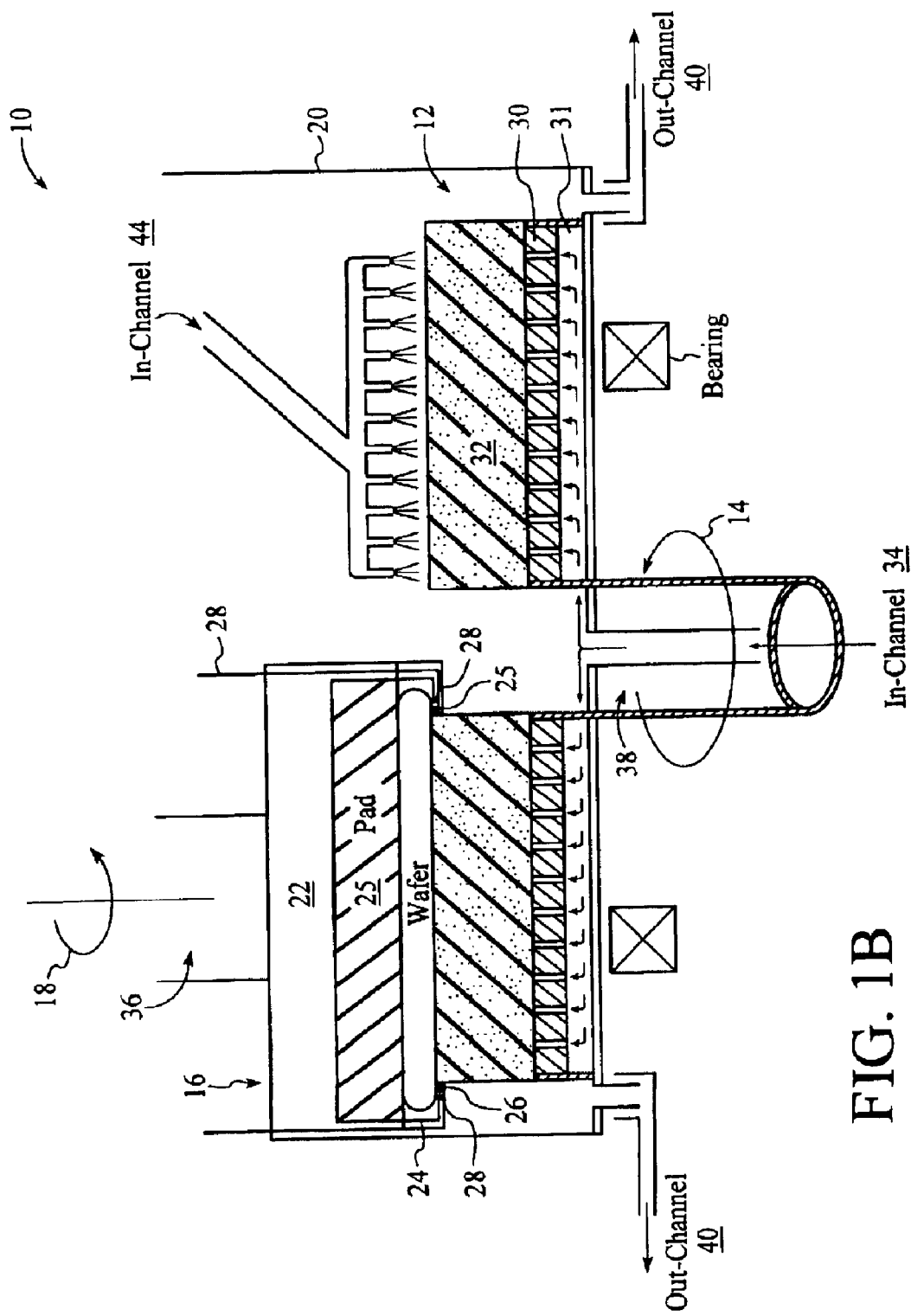

FIGS. 1A and 1B illustrate a first embodiment of the invention, which embodiment has two different modes of operation. In a first mode, a conductive metal, preferably copper, or other conductive material, is applied in vias and/or other desired areas using an electrolyte solution, while build-up of the conductive material on undesired areas is eliminated, or at least minimized, due to the mechanical polishing and/or electrolytic solution deprivation to top surface areas of the semiconductor wafer that is described hereinafter. In a second mode of operation, polishing of the wafer, using a conventional chemical mechanical polishing, can be performed using the same device, to the extent that such chemical mechanical polishing is needed. It is contemplated that according to this embodiment of the present invention that in most circumstances only the first mode of operation will be needed. The second mode of operation, and the structure corresponding thereto, are included for circumstances in which an extremely high degree of polish is desired.

FIG. 1A illustrates an overview of the electro chemical mechanical deposition apparatus 10 according to the first embodiment of the invention, illustrating in perspective view the mechanical pad assembly 12 that has a mechanical pad 32 that rotates around a first axis 14, and a wafer head assembly 16 that has a wafer that rotates around a second axis 18. As illustrated, the wafer rotates within an area that is covered by the mechanical pad 32, as will be described in further detail hereinafter, which area is within container 20 that keeps various solution disposed therein. Although shown as operating upon a single wafer, it is understood that a plurality of wafer lead assemblies 16 could be associated with each mechanical pad assembly 12, and that the apparatus 10 could include a plurality of mechanical pad assemblies 12 as well, each operating on different wafers.

FIG. 1B illustrates a side cross sectional view of the apparatus 10 taken along line A—A of FIG. 1A according to the present invention. As illustrated, the system 10 is capable of depositing thin metal films onto the wafer.

Each wafer head assembly 16 includes a nonconductive, preferably circular, head assembly 22 with a cavity that is preferably a few millimeters deep at its center and which cavity may contain a resting pad 25. The semiconductor wafer is loaded into this cavity 22, backside first, against the resting pad 25 using a conventional type of transport or vacuum mechanism to ensure that he wafer is stationary with respect to the wafer head assembly while in use. A nonconductive retaining ring 24 at the periphery of the wafer head assembly 16 includes at least one O-ring or other rubber type seal 26 and a spring loaded cathode contact electrode 28, which each push against the face of the wafer and hold the wafer in place at its very edge. A liquid-tight seal is thus obtained so that the cathode contact electrode 28 is kept isolated from the solution within the container 20, as described hereinafter, The entire back side of the wafer which pushed against resting pad 25 and the front surface areas (typically the outer 1–10 mm surface of the front surface area) which are under this retaining ring 24 will thus be protected from any and all solution, including electrolyte, as discussed hereinafter.

The mechanical pad assembly 12 is disposed within container 20, which container 20 holds the various solutions that will be introduced, as described previously and hereinafter. Mechanical pad assembly 12 included an anode plate 30 that preferably has a thin flat circular shape and is made of a porous or solid conductive material such as copper and/or platinum and is mounted so that it rotates about the second axis 18, and rests upon a table and bearing support as is known. A mechanical pad 32, as is known is the art and used, as example, in chemical mechanical polishing, and preferably one that is made of a nonconductive porous type material such as polyurethane, is mounted onto the face of the anode plate 30. The mechanical pad 32 preferably has a circular shape, but may be shaped in any other form so long as it can effectively polish the wafer. The electrolyte can be fed to the pad 32 from a reservoir (not shown) located behind the anode plate 32 via a chamber 31, which chamber 31 then feeds the electrolyte up through the anode plate 30 and pad 32 using the in-channel 34. Alternatively, in-channel 44 can also be used to dispense the electrolyte directly down onto the surface of the pad 32.

The wafer head assembly 16 faces toward the mechanical pad assembly 12, and is pushed down with a controlled force. The wafer head assembly 16 rotates around axis 18 using a conventional motorized spindle 36, whereas the mechanical pad assembly 12 rotates around axis 14 using a conventional motorized spindle 38.

Proper drainage channels 40 provide a safe recycling or disposal of electrolyte. Thus, once the electrolyte is placed onto the pad 32 as described above, it can be drained via the drainage channels 40 to a resuscitating reservoir, also not shown, that can replenish and clean the electrolyte, thereby allowing re-sue and being environmentally safe.

The inlet 44 can also be used to apply deionized water when operating in the second mode of the invention, as discussed hereinafter.

In operation according to the first mode of the invention, the apparatus 10 applies, using a power source, a negative potential to the cathode contact 28 and a positive potential to the anode 30. The electrolytic solution is introduced through one or both of the in-channels 34 and 44 to the surface of the mechanical polishing pad 32. When an electric current is established between the two electrodes, molecules of metals in electrolyte are deposited on the surface of the wafer, being attracted thereto by the negative voltage applied to the cathode contact 28. While this is taking place, there is also performed a mechanical polishing using the mechanical pad assembly 12. This mechanical pad assembly 12 substantially prevents molecules of metals from becoming permanently deposited on surfaces of the wafer where such a deposit is undesired, due to the polishing or rubbing action of the mechanical pad 32. Thus, the contaminants or additives referred to above that are presently used to prevent or reduce such depositing are not needed, or alternatively can be used in much smaller percentages. Accordingly, at the conclusion of the first mode of operation, metal is deposited in vias and the like where desired, and is substantially prevented from being deposited in undesired areas.

In a second mode of operation, a number of different conventional operations can be performed, depending upon the chemicals introduced via the in-channel 44. If chemical mechanical polishing is desired, a slurry can be introduced, although this specific mode of operation is not preferred since it increases the amount of impurities introduced into the apparatus fluid chamber substantially. In the preferred second mode of operation, the apparatus 10 can be used to buff polish the seed layer or be used as an electro polisher by reversing the current polarity (cathode and anode polarity), Further, the apparatus 10 can also be purged with water if it is necessary to leave the wafer clean but wet with deionized water, and polishing using the mechanical pad 32 with the deionized water can take place. Thereafter, after lifting the wafer off the pad 32, spin drying of the wafer on the rotating wafer head assembly 16 can take place.

Figure 2:
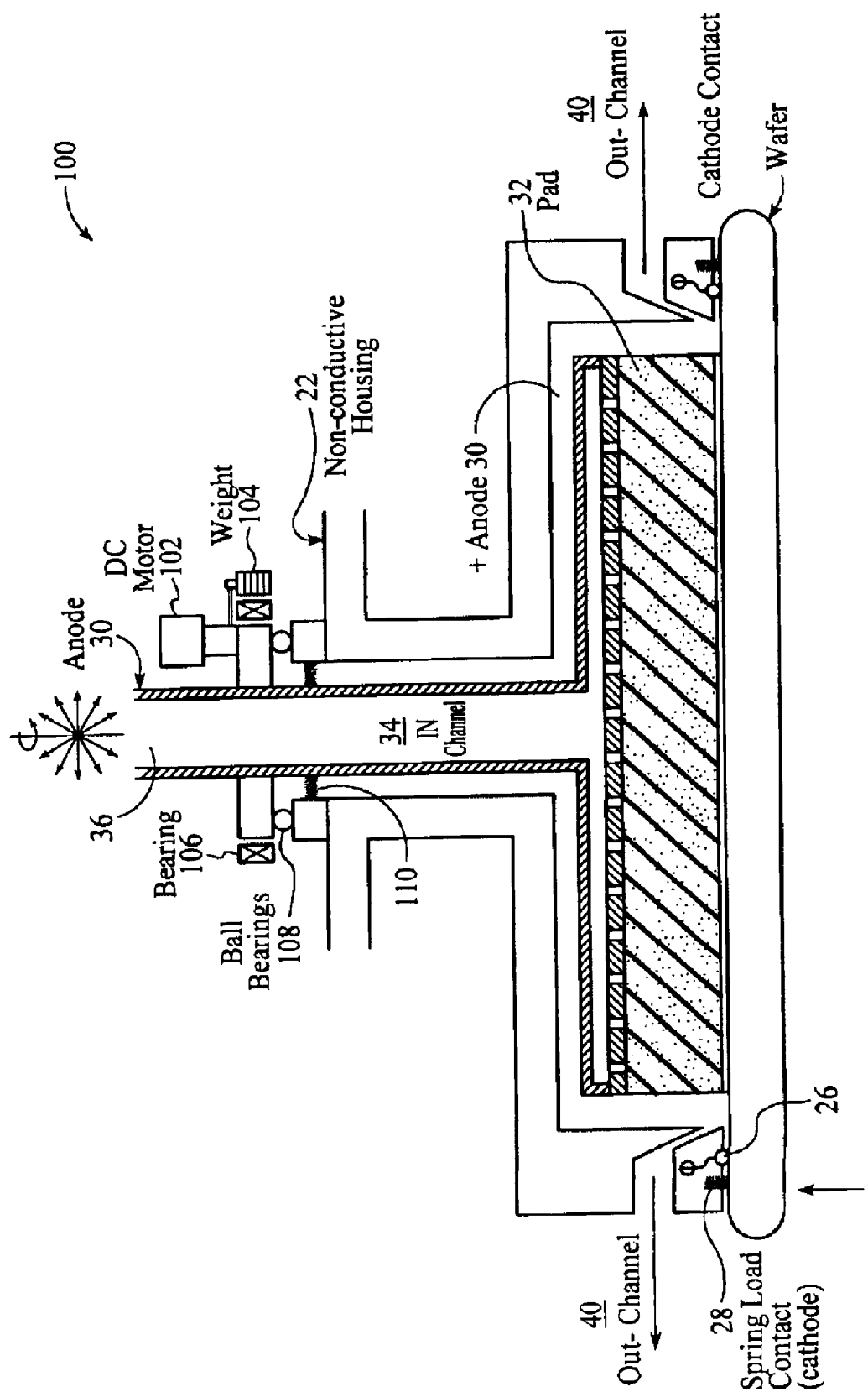
FIG. 2 illustrates a second embodiment of the present invention.

FIG. 2 illustrates another embodiment of the present invention. Like reference numerals are used to indicate structure that corresponds to that of FIGS. 1A and 1B described above. In this embodiment of the invention, the wafer is stationery, and electro chemical mechanical deposition apparatus 100 is disposed within a container (not shown) that collects spent solutions. The electro chemical mechanical deposition apparatus 100 corresponds in structure in large part to the wafer head assembly 16 previously described with reference to FIG. 1B. In this embodiment, however, the electro chemical mechanical deposition apparatus 100 includes a mechanical pad 32, which is rotated by the spindle shaft 36. Spindle shaft 36 is illustrated as being rotated and moved side to side and held in proper position using DC motor 102, weights 104, bearing sets 106 and 108 an springs 110, all of which are conventional.

The electrolyte solution is introduced using in passage 34, and it flows to the desired surface of the wafer through the porous anode 30 and mechanical pad 32. It is expelled through out-channel 40.

Operation of the FIG. 2 embodiment is very similar to that of the first mode described with respect to FIGS. 1A and 1B. Specifically, deposition of a conductive material using an electrolyte, such as described previously, in desired vias and/or other areas, is obtained at the same time that mechanical polishing of the surface of the wafer using rotating pad 32, which may be the shape of a rectangle, a circle, or a pie or the like, takes place.

The electro chemical mechanical deposition apparatus according to the present embodiment also reduces the need for pulse generating power supplies because the mechanical pulsing that is generated from the movement of the pad creates sufficient pulsing. This mechanical pulsing is created as a result of the wafer being in contact with the pad as it is moved in relation to the wafer. The benefit of the mechanical pulsing is that it improves grain size and copper film integrity without the need for power supplies with pulsing capabilities.

Figure 4A:
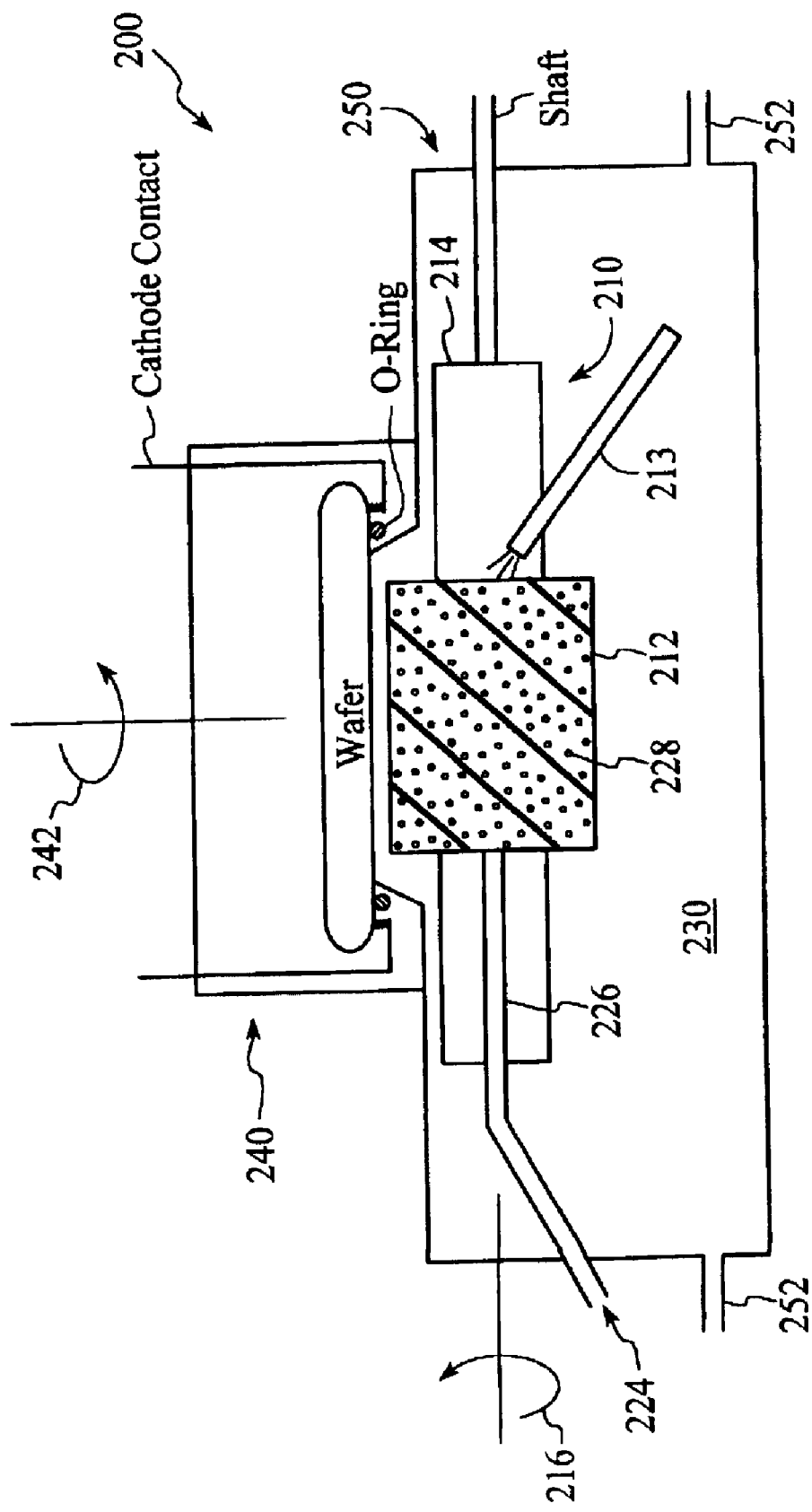
FIGS. 4A–4C illustrate a third embodiment of the present invention.
Figure 4B:
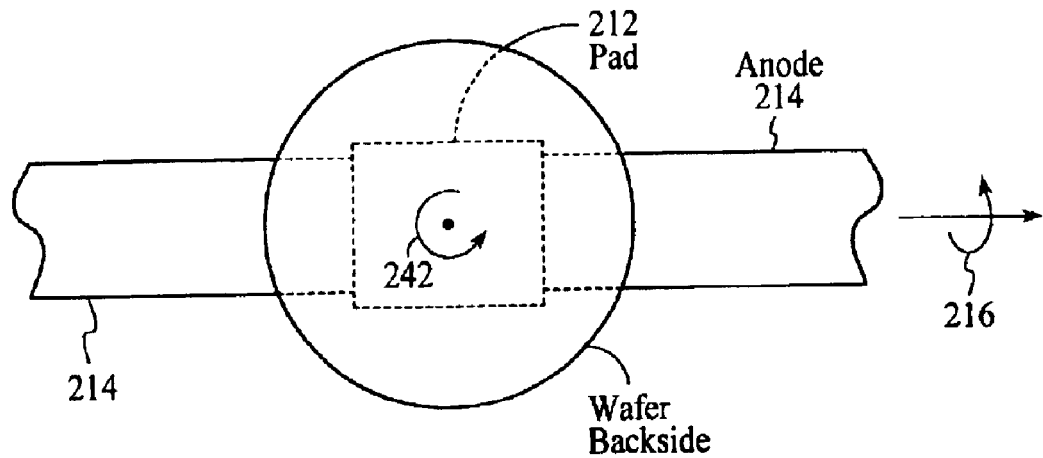
Figure 4C:
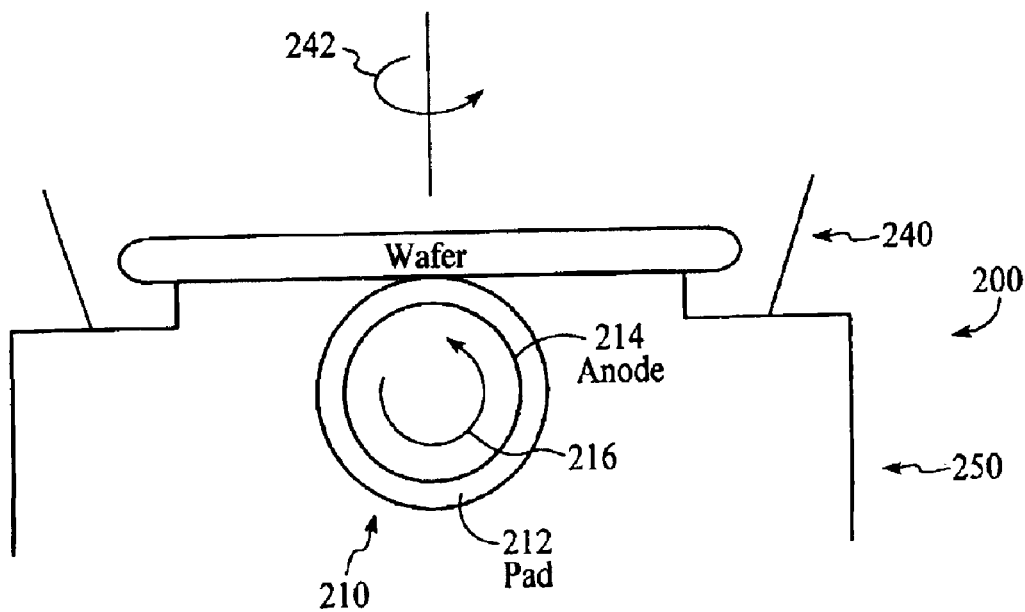

FIGS. 4A–4C illustrate yet another preferred embodiment of the present invention. Like reference numerals are used to indicate structure that corresponds to that of FIGS. 1A, 1B, and 2 described above, In this embodiment of the invention, the electro chemical mechanical deposition apparatus 200 contains a mechanical pad assembly 210 that corresponds to the mechanical pad assembly 12 and a wafer head assembly 240 that corresponds to the wafer head assembly 16. In this embodiment, the electro chemical mechanical deposition apparatus 200 includes a circular or square mechanical pad 212 mounted on a cylindrical anode 214 that rotates abut a first axis 216 as illustrated in FIGS. 4A and 4C, whereas the wafer rotates abut a second axis 242 as illustrated in FIG. 4B.

The mechanical pad 212 can have a size that either polishes the entire usable portion of the wafer, or only a section of the wafer at any given time. If only a portion of the wafer is polished at any given time, a drive assembly (not shown) must also be included in order to move the anode 214, and thereby the mechanical pad 212, so that it is in contact with the portion of the wafer that needs to be acted upon at that moment in time.

In operation, it will be appreciated that the belt-shaped mechanical pad 212 polishes the wafer similar to the manner in which a roller paintbrush paints a wall. While operating, the electrolyte or other solution is introduced to the mechanical pad 212 from a reservoir (not shown) located in proximity to the anode 214. In one specific embodiment, the anode 214 contains an in-channel 224 that includes a passageway 226 within anode 214 and holes 228 that are made in the anode 214, which together provide a path for the solution to be fed to the mechanical pad 212. Alternatively, the electrolyte solution can be dispensed directly onto the pad 212 through a channel 213 in accordance with the methods described earlier herein. The solution will be contained with a non-conductive chamber 230 that is created around the wafer head assembly 240, and an non-conductive solution containment housing 250, which housing contains an out-channel 252. O-rings and other conventional structures, as described earlier herein, to seal the solution within the solution containment housing 250 may be used in this embodiment.

Again, the electro chemical mechanical deposition apparatus according to the present invention reduces the need for pulse generating power supplies because the mechanical pulsing that is generated from the rotating movement of the pad and wafer creates sufficient pulsing.

According to the present invention, in any of the embodiments, since mechanical action is used to prevent undesired build-up of a conductor on undesired areas of a wafer surface, leveling agents are not typically needed, or needed in a much smaller percentage than conventionally used. Further a polished smooth and shiny conductive surface can be obtained.

Although only the above embodiments have been described in detail above, those skilled in the art will readily appreciate that many modification of the exemplary embodiment are possible without materially departing from the novel teachings and advantages of this invention.

What is claimed is:

1. A method of polishing a conductive material from a top surface of a wafer using a pad, a solution and an electrode electrically coupled to the solution, wherein the top surface of the wafer further includes a cavity portion, comprising the steps of:

positioning the pad in close proximity to the top surface of the wafer;

applying the solution through the pad so that the solution is in contact with the top surface of the wafer;

applying a voltage between the top surface of the wafer and the electrode; and polishing the conductive material using the pad to remove the conductive material from the top surface of the wafer, without substantially removing the conductive material within the cavity portion.

2. The method of claim 1, wherein:

the polishing step includes the step of the pad touching the top surface of the wafer.

3. The method of claim 2, wherein the pad is porous and wherein:

the applying step includes the step of introducing the solution through the porous pad.

4. The method of claim 2, wherein the method further comprises the prior step of:

depositing the conductive material on the top surface of the wafer.

5. The method of claim 4, wherein the solution includes a slurry.

6. The method of claim 2, wherein:

the polishing step includes the step of moving the pad and the top surface of the wafer relative to one another.

7. An integrated circuit manufactured including the steps of claim 6.

8. The method of claim 6, wherein the solution includes a slurry.

9. The method of claim 2, wherein:

the polishing step includes the step of moving the pad and the top surface of the wafer substantially linearly relative to one another.

10. The method of claim 2, wherein the solution includes a slurry.

11. The method of claim 1, wherein the pad is porous and wherein:

the applying step includes the step of introducing the solution through the porous pad.

12. The method of claim 11, wherein the method further comprises the prior step of:

depositing the conductive material on the top surface of the wafer.

13. The method of claim 12, wherein the conductive material is copper.

14. An integrated circuit manufactured including the steps of claim 11.

15. The method of claim 1, wherein the method further comprises the prior step of:

depositing the conductive material on the top surface of the wafer.

16. An integrated circuit manufactured including the steps of claim 1.

17. The method of claim 1, wherein:

the polishing step includes the step of pulsing the electric current at the top surface of the wafer.

18. The method of claim 1, wherein the conductive material is copper.

19. A method of forming a conductive material on desired areas of a workpiece and preventing the accumulation of the conductive material on undesired areas of the workpiece using a pad, a solution and an electrode electrically coupled to the solution, comprising the steps of:

positioning the pad in close proximity to the workpiece;

applying the solution through the pad so that the solution is in contact with the workpiece;

applying a voltage between the workpiece and the electrode; and forming the conductive material on the workpiece using the pad to prevent the accumulation of the conductive material on undesired areas of the workpiece.

20. The method of claim 19, wherein:

the forming step includes the step of the pad touching the workpiece.

21. The method of claim 20, wherein the pad is porous and wherein:

the applying step includes the step of introducing the solution through the porous pad.

22. The method of claim 20, wherein:

the forming step includes the step of moving the pad and the workpiece relative to one another.

23. The method of claim 22, wherein the solution includes a slurry.

24. An integrated circuit manufactured including the steps of claim 22.

25. The method of claim 20, wherein:

the forming step includes the step of moving the pad and the workpiece substantially linearly relative to one another.

26. The method of claim 20, wherein the solution includes a slurry.

27. The method of claim 19, wherein the forming step includes the steps of:

depositing the conductive material on the workpiece to fill predetermined features in the workpiece; and polishing the conductive material on the workpiece using the pad to remove the conductive material from undesired areas of the workpiece.

28. The method of claim 27, wherein:

during at least a portion of the depositing step, the step of applying a voltage between the workpiece and the electrode is performed at a first polarity; and during at least a portion of the polishing step, the step of applying a voltage between the workpiece and the electrode is performed at a second polarity opposite the first polarity.

29. The method of claim 28, wherein the pad is porous and wherein:

the applying step includes the step of introducing the solution through the porous pad.

30. The method of claim 27, wherein the pad is porous and wherein:

the applying step includes the step of introducing the solution through the porous pad.

31. An integrated circuit manufactured including the steps of claim 27.

32. The method of claim 19, wherein the pad is porous and wherein:

the applying step includes the step of introducing the solution through the porous pad.

33. The method of claim 19, wherein the method further comprises the prior step of:

depositing the conductive material on the workpiece to fill predetermined features in the workpiece.

34. The method of claim 33, wherein the conductive material is copper.

35. An integrated circuit manufactured including the steps of claim 19.

36. The method of claim 19, wherein:

the forming step includes the step of the pulsing the electric current at the workpiece.

37. The method of claim 19, wherein the conductive material is copper.

* * * * *